United States Patent [19]

Torkkola

[11] Patent Number: 5,675,659
[45] Date of Patent: Oct. 7, 1997

[54] METHODS AND APPARATUS FOR BLIND SEPARATION OF DELAYED AND FILTERED SOURCES

[75] Inventor: Kari Torkkola, Chandler, Ariz.

[73] Assignee: Motorola, Schaumburg, Ill.

[21] Appl. No.: 571,329

[22] Filed: Dec. 12, 1995

[51] Int. Cl.$^6$ ............................................. H04B 15/00
[52] U.S. Cl. ................................. 381/94; 381/71
[58] Field of Search ................ 381/94, 71; 364/724.17, 364/724.19; 342/116

[56] References Cited

U.S. PATENT DOCUMENTS

| | | | |
|---|---|---|---|
| 5,237,618 | 8/1993 | Bethel | 381/94 |
| 5,509,078 | 4/1996 | Hiraoka et al. | 381/94 |
| 5,515,445 | 5/1996 | Baumhauer et al. | 381/94 |
| 5,539,832 | 7/1996 | Weinstein et al. | 381/94 |
| 5,546,458 | 8/1996 | Iwami | 381/94 |
| 5,557,682 | 9/1996 | Warner et al. | 381/94 |

OTHER PUBLICATIONS

John C. Platt et al., "Networks for the Separation of Sources that are Superimposed and Delayed", Advances in Neural Information Processing Systems 4, Morgan-Kaufmann, 1992, pp. 730-737.

Christian Jutten et al., "Blind separation of sources, Part I: An adaptive algorithm based on neuromimetic architecture", Signal Processing, 24(1):1-10, 1991.

Anthony J. Bell et al., "An information-maximisation approach to blind separation and blind deconvolution", Proc. ICASSP, pp. 1-36, Detroit, MI, May 9-12, 1995.

Primary Examiner—Curtis Kuntz
Assistant Examiner—Duc Nguyen
Attorney, Agent, or Firm—Eugene A. Parsons

[57] ABSTRACT

A method of recovering source signals from an equal number of mixed signals including components of the source signals. Channel one and two mixed signals are multiplied by channel one and two adaptive weights to produce channel one and two product signals, respectively. A channel one filtered feedback signal is generated from a channel two approximation signal and a channel two filtered feedback signal is generated from a channel one approximation signal. The channel one filtered feedback signal is added to the channel one product signal to produce the channel one approximation signal and the channel two filtered feedback signal is added to the channel two product signal to produce the channel two approximation signal. A nonlinear function is applied to the approximation signals to produce output signals. The adaptive weights and the filtered feedback signals are adjusted to maximize entropy of the output signals.

16 Claims, 2 Drawing Sheets

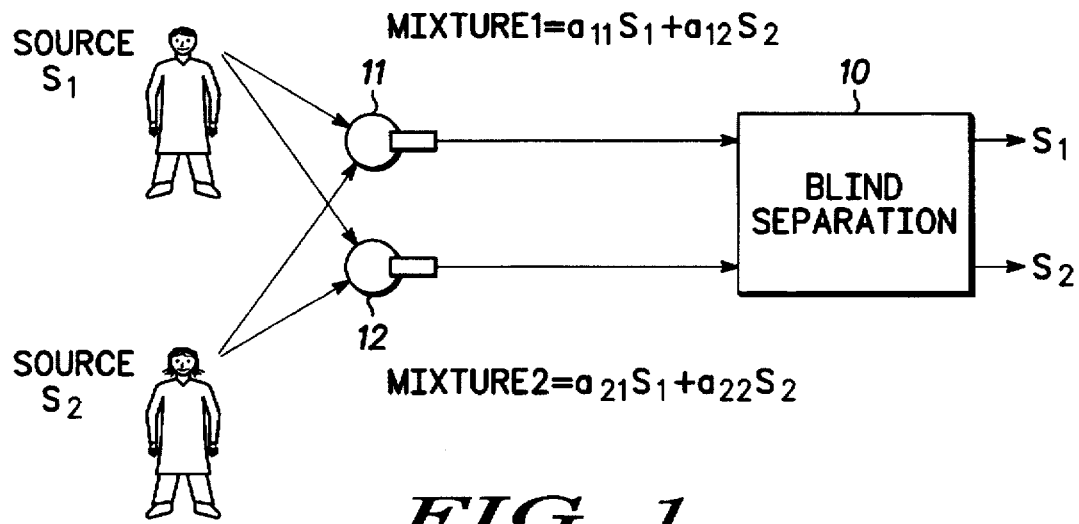
FIG. 1
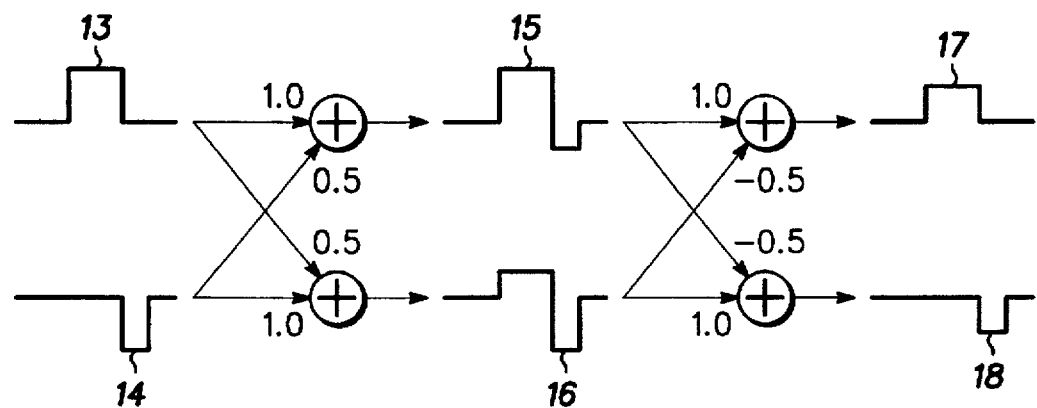
FIG. 2
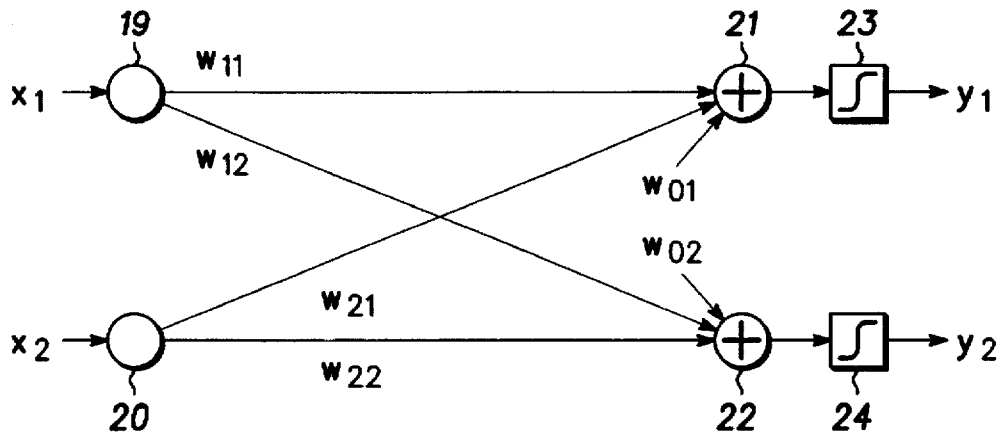
- PRIOR ART -   FIG. 3

30

40

METHODS AND APPARATUS FOR BLIND SEPARATION OF DELAYED AND FILTERED SOURCES

FIELD OF THE INVENTION

The present invention pertains to methods for separating signal sources and more specifically to the blind separation of multiple sources.

BACKGROUND OF THE INVENTION

Blind source separation denotes observing mixtures of independent sources, and by making use of these mixed signals only and nothing else, recovering the original or source signals.

The separation of independent sources from an array of sensors is a classic but difficult problem in signal processing. Generally, the signal sources as well as their mixture characteristics are unknown. Without knowledge of the signal sources, other than a general assumption that the sources are independent, the signal processing is commonly known in the art as the "blind separation of sources". The separation is "blind" because nothing is known about the independent source signals.

A typical example of the blind separation of source signals is where the source signals are sounds generated by two independent sources, such as two (or more) separate speakers. An equal number of microphones (two in this example) are used to produce mixed signals, each composed as a weighted sum of the source signals. Each of the source signals is delayed and attenuated in some unknown amount during passage from the speaker to a microphone, where it is mixed with the delayed and attenuated components of the other source signals. Multi-path signals, generated by multiple reflections of the source signals, are further mixed with direct source signals. This is generally known as the "cocktail party" problem, since a person generally wishes to listen to a single sound source while filtering out other interfering sources, including multi-path signals.

Those skilled in the signal processing arts have been eager to solve blind source separation problems because of their broad application to many communication fields. In the cellular telecommunications art, for example, a receiver must eliminate multi-path signals to avoid unacceptable levels of interference.

Jutten and Herault ("Space or Time Adaptive Signal Processing by Neural Network Modules", *Neural Networks for Computing*, Snowbird, Utah, J. S. Denker, Ed., AIP Conference Proceedings 151, pp. 207–211, 1986) first introduced a simple neural network with adaptive separation capability. A detailed discussion of the Jutten-Herault network, refer to Pierre Comon, et al. "Blind Separation of Sources, Part II: Problem Statement", *Signal Processing* 24 (1). pp. 11–20 (1991). Comon et al. observe that the Jutten-Herault network functions by searching for common zeros of N functionals through pipelined stochastic iterations. Comon et al. show that the Jutten-Herault network relies on the assumed independence of the mixed signals, which follows from the assumption of independent source signals only if the mixed signals are linear combinations of the source signals. Comon et al. note that any introduction of non-linearity changes the problem to one requiring the solution of an overdetermined system on non-linear equations with several variables.

Generally, the prior art is concerned with instantaneous mixtures but cannot handle delayed and filtered sources. For example, Platt and Faggin (Networks For the Separation of Sources That Are Superimposed and Delayed", *Advances in Neural Information Processing Systems*, Vol. 4, Morgan-Kaufmann, San Mateo, Calif., 1992) have proposed a network that modifies the Jutten-Herault network to also estimate a matrix of time delays while estimating the Jutten-Herault network mixing matrix. Platt and Faggin have proposed a new network to separate source signals that are mixed either with time delays or through filtering. However, Platt and Faggin also note that their learning technique has multiple stable states and they cannot predict convergence to a solution (i.e. separate source signals) except through experimentation.

A blind source separation system that works under real world conditions would have a multitude of applications: array processing, speech signal enhancement in the presence of noise, speaker separation in teleconferencing situations (cocktail party problems), elimination of multipath reverberation distortion, reducing intersymbol interference, and others. Current algorithms all have shortcomings that prevent their successful application to many real world situations, such as wideband audio recordings.

Accordingly, the provision of a blind source separation system that operates under real world conditions is highly desirable.

It is a purpose of the present invention to provide a new and improved blind source separation system It is another purpose of the present invention to provide a new and improved blind source separation system that operates under real world conditions It is a further purpose of the present invention to provide a new and improved blind source separation system that has the capabilities of dealing with sources that have been delayed with respect to each other.

It is still a further purpose of the present invention to provide a new and improved blind source separation system that is capable of separating sources which include a sum of multipath copies of the sources distorted by the environment.

SUMMARY OF THE INVENTION

The above problems and others are at least partially solved and the above purposes and others are realized in a novel method of recovering source signals from an equal number of mixed signals including components of the source signals. As a first step of the method, channel one and two mixed signals are multiplied by channel one and two adaptive weights to produce channel one and two product signals, respectively. A channel one filtered feedback signal is generated from a channel two approximation signal and a channel two filtered feedback signal is generated from a channel one approximation signal. The channel one filtered feedback signal is added to the channel one product signal to produce the channel one approximation signal and the channel two filtered feedback signal is added to the channel two product signal to produce the channel two approximation signal. A nonlinear function is applied to the approximation signals to produce output signals. The adaptive weights and the filtered feedback signals are adjusted to maximize entropy of the channel one and channel two output signals.

In a preferred embodiment of the present invention the step of multiplying the channel one mixed signal by the channel one adaptive weight to produce the channel one product signal includes multiplying the channel one mixed signal by a series of different weights associated with a series of different delays and doing a summation to produce the channel one product signal and the step of multiplying the channel two mixed signal by the channel two adaptive weight to produce the channel two product signal includes multiplying the channel two mixed signal by a series of different weights associated with a series of different delays and doing a summation to produce the channel two product signal. Also, the step of generating the channel one filtered feedback signal includes multiplying the channel two approximation signal by a series of different weights associated with a series of different delays and doing a summation to produce the channel one filtered feedback signal and the step of generating the channel two filtered feedback signal includes multiplying the channel one approximation signal by a series of different weights associated with a series of different delays and doing a summation to produce the channel two filtered feedback signal.

BRIEF DESCRIPTION OF THE DRAWINGS

Referring to the drawings:

FIG. 1 is a semi-schematic representation illustrating the blind source separation problem;

FIG. 2 illustrates several simplified waveforms present in the structure of FIG. 1;

FIG. 3 is a simplified block/schematic diagram of a prior art blind source separation system;

DESCRIPTION OF THE PREFERRED EMBODIMENT

Figure 4:
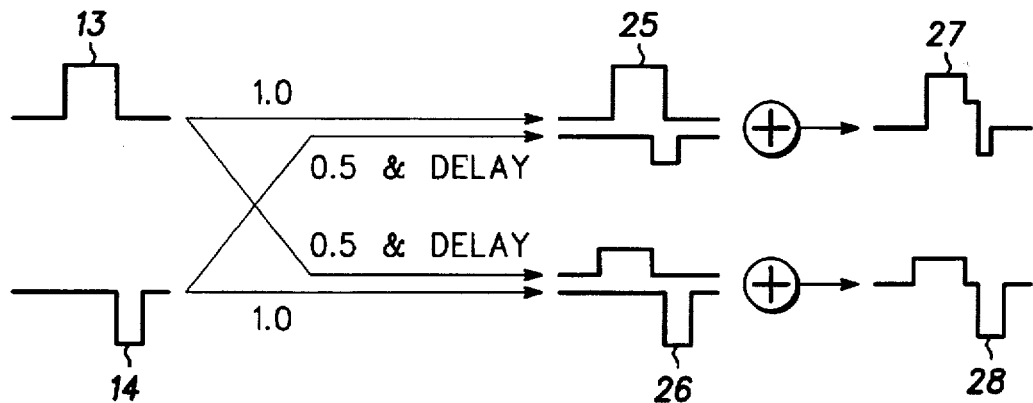
FIG. 4 illustrates several simplified waveforms present in the structure of FIG. 3.

The basic problem of separating blind sources can be seen most clearly by referring to the simplified representation of FIG. 1. In the specific examples utilized hereafter, the sources will be signals representative of sounds, but it should be understood that the source signals could be anything capable of being sensed and processed, such as light signals, audio signals, RF signals, vibration measurements, or any system that might include crosstalk or similar types of interference. In FIG. 1, a blind source separation system is represented by a classic black box 10 containing (at this time) unknown components. A pair of microphones 11 and 12 provide two inputs to black box 10, which inputs are derived from two separate independent sources $S_1$ and $S_2$. Microphone $S_1$ provides a first mixed signal $a_{11}S_1+a_{12}S_2$ and microphone provides a second mixed signal $a_{21}S_1+a_{22}S_2$. As will be understood, the "a's" in the mixed signals represent some unknown fixed amplitude. Black box 10 only has access to the two input signals and must separate them into the two original source signals $S_1$ and $S_2$.

In a very simplified example, source signals $S_1$ and $S_2$ are represented, in FIG. 2, by pulses (rectangular waveforms) 13 and 14, respectively, with pulse 14 being negative, or the opposite of pulse 13. The first mixed signal applied to the first input of black box 10 is represented by waveform 15, which includes a portion (equal to one) of pulse 13 and a portion (equal to one half in this simplified example) of pulse 14. Similarly, the second input of black box 10 is represented by waveform 16, which includes a portion (equal to one) of pulse 14 and a portion (equal to one half) of pulse 13. It follows that black box 10 must subtract a portion of pulse 14 from the portion of pulse 13 in the upper channel to arrive at a pure source signal $S_1$. Also, black box 10 must subtract a portion of pulse 13 from the portion of pulse 14 in the lower channel to arrive at a pure source signal $S_2$. If the portions of pulse 14 and pulse 13 subtracted from the portions of pulse 13 and pulse 14, respectively, are exactly correct pure source signals at the outputs of black box 10 will be achieved. However, the problem is to find a criterion that determines when the outputs are separated.

Recently, Bell and Sejnowski described that a possible criterion for blind source separation is mutual information (A. J. Bell and T. J. Sejnowski, Blind Separation and Blind Deconvolution: An information Theoretic Approach", Proc. ICASSP, pp. 3415–3418, Detroit Mich., May 9–12, 1995 and A. J. Bell and T. J. Sejnowski, An Information-maximization Approach to Blind Separation and Blind Deconvolution", Technical Report INC-9501, USCD, Institute for Neural Computation, February 1995). A simplified block/schematic diagram of the Bell and Sejnowski blind source separation system is illustrated in FIG. 3.

Referring specifically to FIG. 3, two sensors 19 and 20 receive two mixed signals, represented as $x_1$ and $x_2$, from unknown sources. Mixed signal $x_1$ is multiplied by a weight $w_{11}$ and applied to a summing circuit 21. Mixed signal $x_1$ is also multiplied by another weight $w_{12}$ and applied to a summing circuit 22. Similarly, mixed signal $x_2$ is multiplied by a weight $w_{22}$ and applied to a summing circuit 22. Mixed signal $x_1$ is also multiplied by another weight $w_{21}$ and applied to summing circuit 21. Bias weights $w_{01}$ and $w_{02}$ are also applied to summing circuits 21 and 22, respectively, to adjust the mean values of the sums. Output signals from summing circuits 21 and 22 are then applied to output circuits 23 and 24, respectively, which then pass them through a nonlinear function and supply separated source signals $y_1$ and $y_2$.

Bell and Sejnowski proposed to learn the various weights (W) by minimizing the mutual information between components of vector $y(t)=g(u(t))$, where u is the vector or output signals from summing circuits 21 and 22, and g is a nonlinear function approximating the cumulative density function of the sources. Bell and Sejnowski showed that for positively kurtotic signals (like speech) minimizing the mutual information between components of y is equal to maximizing the entropy of y, which can be written as $H(y)=-E[\ln(f_y(y))]$, where $f_y(y)$ denotes the probability density function of y. Denoting the determinant of the Jacobian of the whole net by $|J|$, $f_y(y)$ can be written as $f_x(x)/|J|$ (Jacobian is a matrix with entries of $\partial x_i/\partial y_j$). Now, maximizing the entropy of the output signals leads to maximizing $E[\ln|J|]$, which in turn can be developed into the following stochastic gradient ascent rule using instances of $x(t)$ and $y(t)$ instead of using the expectation:

$$\Delta W \propto (1 \times 2y(t)) \times (t)^T + [W^T]^{-1},$$

$$\Delta w_o \propto 1 - 2y(t).$$

To derive the above adaptation rule, $g(y)=1/(1+e^{-y})$ was used as the nonlinear function to approximate the cumulative density function.

There are several obstacles to applying this and Jutten-Herault algorithms to real world situations. These include the effect of noise to successful learning of the separating solution, possibly an unknown number of sources (especially noise sources), and the assumption that the source signals are stationary. Most notable is the assumption of the simultaneous mixing of the sources. In any real-world recording, where the propagation of the signals through the medium is not instantaneous (like sound through air or water), there will be phase differences between the sources in the mixtures. This is illustrated in the several simplified waveforms of FIG. 4. Sources 13 and 14 (previously described in conjunction with FIG. 2) are mixed to produce first and second mixed signals 25 and 25. However, in this instance the portion of signal 14 mixed with signal 13 is delayed by some unknown amount. Similarly, the portion of signal 13 mixed with signal 14 is delayed by some unknown amount. As can be seen from waveforms 27 and 28, separated sources can not be achieved as a linear combination of the mixtures. Current blind source separation systems can not tolerate these delays. A related problem is the multipath arrival of the signals. In general, each sensor is not observing just a clean copy of the source signal, but a sum of multipath copies distorted by the environment, for example, by the impulse response of a room.

Figure 5:
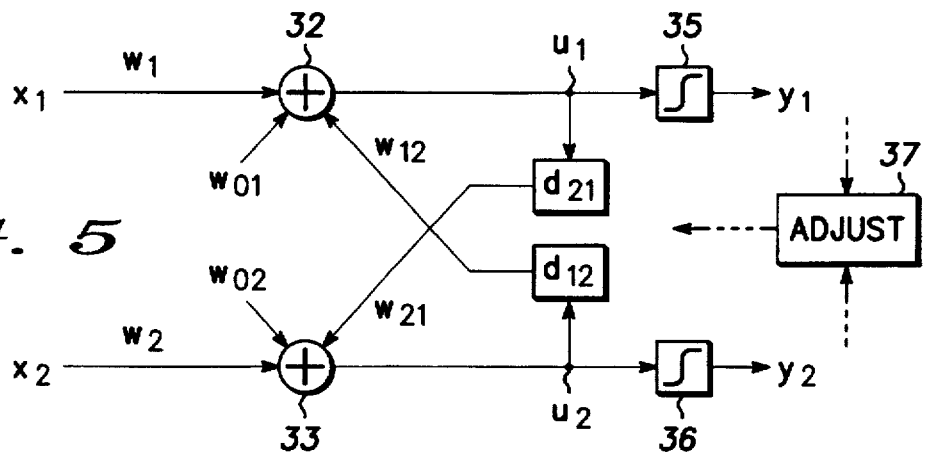
FIG. 5 illustrates a simplified block/schematic diagram of a blind source separation system in accordance with the present invention.

Referring now to FIG. 5, a simplified block/schematic diagram of a blind source separation system 30 in accordance with the present invention is illustrated. To understand the operation of system 30, assume for simplicity two sources $y_1$ and $y_2$ and their two mixtures $x_1$ and $x_2$. It will of course be understood that the following description can be generalized to any number of sources and their mixtures. Channel one mixed signal $x_1$ is multiplied by a channel one adaptive weight $w_1$ to produce a channel one product signal which is applied to a summation circuit 32. Also, channel two mixed signal $x_2$ is multiplied by a channel two adaptive weight $w_2$ to produce a channel two product signal which is applied to a summation circuit 33. As explained previously, bias weights $w_{01}$ and $w_{02}$ are also applied to summation circuits 32 and 33, respectively, although in some special instances these signals may be ignored or built into the other components.

The output signals of summation circuits 32 and 33 are approximation signals $u_1$ and $u_2$, respectively, which are utilized to generate filtered feedback signals that are then applied to summation circuits 32 and 33, respectively. In this specific embodiment, the channel one filtered feedback signal is generated by delaying channel two approximation signal $u_2$ by a delay $d_{12}$ and multiplying the delayed signal by a weight $w_{12}$. Similarly, the channel two filtered feedback signal is generated by delaying channel one approximation signal $u_1$ by a delay $d_{21}$ and multiplying the delayed signal by a weight $w_{21}$. Approximation signals $u_1$ and $u_2$ are also applied to output circuits 35 and 36, which pass them through a sigmoid function, to produce channel one and channel two output signals $y_1$ and $y_2$. The output signals are utilized in an adjustment circuit 37 to adjust channel one adaptive weight $w_1$, the channel one filtered feedback signal, channel two adaptive weight $w_2$, and the channel one and two feedback weights and the delays to maximize entropy of the channel one and channel two output signals $y_1$ and $y_2$ and, thereby, recover first source signal as the output signal $y_1$ and second source signal as the output signal $y_2$.

System 30 thus computes the following, where $u_i$ are the outputs before the nonlinearities, and $w_{0i}$ are the bias weights:

$$u_1(t)=w_1 x_1(t)+w_{12}u_2(t-d_{12})+w_{01}$$

$$u_2(t)=w_2 x_2(t)+w_{21}u_1(t-d_{21})+w_{02}$$

$$y_1(t)=g(u_1(t))$$

$$y_2(t)=g(u_2(t))$$

where $g$ is the logistic function $g(u)=1/(1+e^{-u})$. $g$ is also referred to as a sigmoid function.

The mutual information between outputs $y_1$ and $y_2$ is minimized by maximizing the entropy at the outputs, which is equal to maximizing $E[\ln|J|]$. The determinant of the Jacobian of the network is now $$|J|=\frac{\partial y_1}{\partial x_1}\frac{\partial y_2}{\partial x_2}-\frac{\partial y_1}{\partial x_2}\frac{\partial y_2}{\partial x_1}=y_1'y_2'D$$

$$\ln|J|=\ln(y_1')+\ln(y_2')+\ln(D) \quad (1)$$

where D=

$$\left(\frac{\partial u_1}{\partial x_1}\frac{\partial u_2}{\partial x_2}-\frac{\partial u_1}{\partial x_2}\frac{\partial u_2}{\partial x_1}\right)=w_1 w_2, \ y_1'=\frac{\partial y_1}{\partial u_1}, \text{ and } y_2'=\frac{\partial y_2}{\partial u_2}$$

The adaptation rule for each parameter of the network can now be derived by computing the gradient of $\ln|J|$ with respect to that parameter. For $w_1$ the following is obtained $$\Delta w_1 \propto \frac{\partial \ln|J|}{\partial w_1}=\frac{1}{y_1'}\frac{\partial y_1'}{\partial w_1}+\frac{1}{y_2'}\frac{\partial y_2'}{\partial w_1}+\frac{1}{D}\frac{\partial D}{\partial w_1} \quad (2)$$

For the logistic function $\partial y_i'/\partial y_i=1-2y_i$. Thus, for the partial derivatives:

$$\frac{\partial y_1'}{w_1}=\frac{\partial y_1'\partial y_1\partial u_1}{\partial y_1 \partial u_1 \partial w_1}=(1-2y_1)y_1'x_1, \quad (3)$$

$$\frac{\partial y_2'}{\partial w_1}=\frac{\partial y_2'\partial y_2\partial u_2}{\partial y_2\partial u_2\partial w_1}=(1-2y_2)y_2'0=0,$$

$$\frac{\partial D}{\partial w_1}=\frac{\partial(w_1 w_2)}{\partial w_1}=w_2.$$

The adaptation rule for $w_1$ becomes the following from equation (2) above (similarly for $w_2$):

$$\Delta w_1 \propto (1-2y_1)x_1+1/w_1,$$

$$\Delta w_2 \propto (1-2y_2)x_2+1/w_2, \quad (4)$$

The bias adaptation is $\Delta w_{0i} \propto 1-2y_i$. The role of these weights and biases is to scale and to shift the data so as to maximize the information passed through the sigmoid function $g$.

For $w_{12}$ the partial derivatives are as follows:

$$\frac{\partial y_1'}{\partial w_{12}}=\frac{\partial y_1'\partial y_1\partial u_1}{\partial y_1\partial u_1\partial w_{12}}=(1-2y_1)y_1'u_2(t-d_{12}), \quad (5)$$

$$\frac{\partial y_2'}{\partial w_{12}}=\frac{\partial y_2'\partial y_2\partial u_2}{\partial y_2\partial u_2\partial w_{12}}=(1-2y_2)y_2'0=0$$

$$\frac{\partial D}{\partial w_{12}}=\frac{\partial(w_1 w_2)}{\partial w_{12}}=0$$

Thus the adaptation for $w_{12}$ is the following (similarly for $w_{21}$):

$$\Delta w_{12} \propto (1-2y_1)u_2(t-d_{12}),$$

$$\Delta w_{21} \propto (1-2y_2)u_1(t-d_{21}), \quad (6)$$

These rules decorrelate the present squashed output $y_i$ from the other source $u_j$ at delay $d_{ij}$, which is equivalent to separation. Note that in equations (5) and (6) the time indices of $u_1$ and $u_2$ are given in parentheses, whereas for all other variables the time is implicitly assumed to be t. All the partial derivatives starting from equation (1) are also taken at time instance t, which is why it is not necessary to expand the cross partial derivatives recursively backwards into time.

The partial derivatives for the delay $d_{12}$ are:

$$\frac{\partial y_1'}{\partial d_{12}} = \frac{\partial y_1'\partial y_1 \partial u_1}{\partial y_1 \partial u_1 \partial d_{12}} = (1-2y_1)y_1'w_{12}(-\dot{u}_2(t-d_{12})), \quad (7)$$

$$\frac{\partial y_2'}{\partial d_{12}} = \frac{\partial y_2'\partial y_2 \partial u_2}{\partial y_2 \partial u_2 \partial d_{12}} = (1-2y_2)y_2'0 = 0,$$

$$\frac{\partial D}{\partial w_{12}} = \frac{\partial (w_1 w_2)}{\partial w_{12}} = 0,$$

which takes advantage of the fact that $$\frac{\partial u_2(t-d_{12})}{\partial d_{12}} = \frac{d}{dt}(-u_2(t-d_{12})) = -\dot{u}_2(t-d_{12})$$

The adaptation rules for the delays become the following (again, only the time indices for $u_i$ are explicitly written):

$$\Delta d_{12} \propto -(1-2y_1)w_{12}\dot{u}_2(t-d_{12}),$$

$$\Delta d_{21} \propto -(1-2y_2)w_{21}\dot{u}_1(t-d_{21}), \quad (8)$$

It is remarkable that every adaptation rule is local, that is, to adapt a weight or a delay in a branch of the network, only the data coming in or going out of the branch are needed. Generalization to N mixtures can thus be done simply by substituting other indices for 1 and 2 in equations (6) and (8) and summing such terms.

Figure 6:
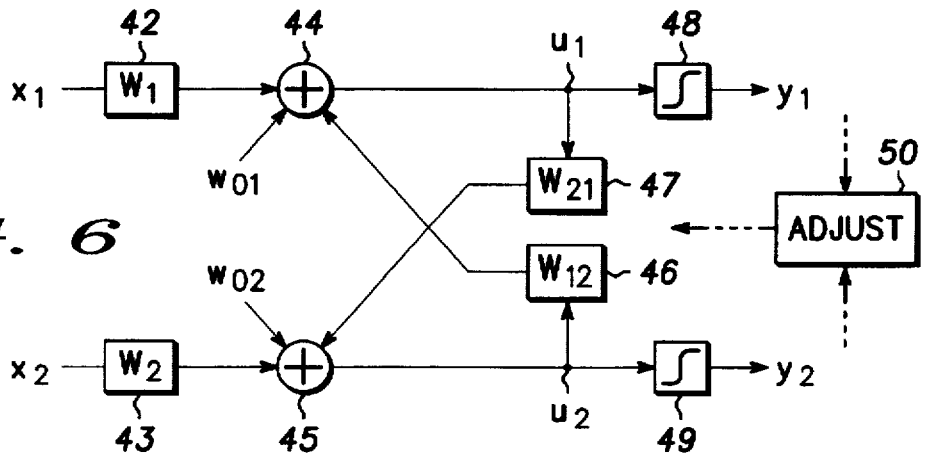
FIG. 6 illustrates another simplified block/schematic diagram of a blind source separation system in accordance with the present invention.

As can be seen by referring to FIG. 6, a simplified block/schematic diagram of another blind source separation system 40 in accordance with the present invention is illustrated. System 40 receives mixed signals $x_1$ and $x_2$ at inputs to adaptive filters 42 and 43, respectively. Within these filters, channel one mixed signal $x_1$ is essentially multiplied by a series of different weights associated with a series of different delays and a summation is done in adaptive filter 42 to produce a channel one product signal that is applied to a channel one summation circuit 43. Also, channel two mixed signal $x_2$ is essentially multiplied by a series of different weights associated with a series of different delays and a summation is done in adaptive filter 43 to produce a channel one product signal that is applied to a channel one summation circuit 44. Further, as explained previously, bias weights $w_{01}$ and $w_{02}$ are also applied to summation circuits 44 and 45, respectively, although in some special instances these signals may be ignored or built into the other components.

The output signals of summation circuits 44 and 45 are approximation signals $u_1$ and $u_2$, respectively, which are utilized to generate filtered feedback signals that are then applied to summation circuits 45 and 44, respectively. In this specific embodiment, the channel one filtered feedback signal is generated by passing channel two approximation signal $u_2$ through another adaptive filter 46 where $u_2$ is essentially multiplied by a series of different weights associated with a series of different delays and a summation is done in adaptive filter 46 to produce a channel one filtered feedback signal that is applied to channel one summation circuit 44. Also, the channel two filtered feedback signal is generated by passing channel one approximation signal $u_1$ through another adaptive filter 47 where $u_1$ is essentially multiplied by a series of different weights associated with a series of different delays and a summation is done in adaptive filter 47 to produce a channel two filtered feedback signal that is applied to channel two summation circuit 45.

Approximation signals $u_1$ and $u_2$ are also applied to output circuits 48 and 49 which pass $u_1$ and $u_2$ through nonlinearities to produce output signals $y_1$ and $y_2$. The output signals are utilized in an adjustment circuit 50 to adjust channel one and channel two adaptive filters 42, 43, 46 and 47, to maximize entropy of the channel one and channel two output signals $y_1$ and $y_2$ and, thereby, recover the first source signal as the output signal $y_1$ and the second source signal as the output signal $y_2$ While adaptive delays suffice for some applications, for most audio signals they are not enough. The acoustic environment (e.g. a room) imposes a different impulse response between each source and microphone pair. Moreover, the microphones may have different characteristics, or at least their frequency response may differ for sources in different directions. To overcome these disadvantages, blind source separation system 40 of FIG. 6 is utilized, the operation of which is explained by modeling it as the convolved mixtures set forth below. For simplicity, two sources in the z-transform domain are shown, but it will be understood that this can again be generalized to any number of sources.

$$X_1(z)=A_{11}(z)S_1(z)+A_{12}(z)S_2(z),$$

$$X_2(z)=A_{22}(z)S_2(z)+A_{21}(z)S_1(z), \quad (9)$$

where $A_{ij}$ are the z-transforms of any kind of filters and $S_1$ and $S_2$ are the sources. Solving for the sources S in terms of the mixture signals $X_1$ and $X_2$:

$$S_1(z)=(A_{22}(z)X_1(z)-A_{21}(z)X_2(z))/G(z),$$

$$S_2(z)=(A_{11}(z)X_2(z)-A_{12}(z)X_1(z))/G(z). \quad (10)$$

By G(z) is denoted as $A_{12}(z)A_{21}(z)-A_{11}(z)A_{22}(z)$. This gives a feedforward architecture for separation. However, the simple feedforward architecture by itself does not result in the solution of equation (10). In addition to separation, it has the side-effect of whitening the outputs. The whitening effect is avoided by using blind source separation system 40 of FIG. 6.

In system 40, outputs before nonlinearities (approximation signals) are:

$$U_1(z)=W_{11}(z)X_1(z)+W_{12}(z)U_2(z),$$

$$U_2(z)=W_{22}(z)X_2(z)+W_{21}(z)U_1(z), \quad (11)$$

Using equations (9) and (11) and designating adaptive filter 42 as $W_{11}$, adaptive filter 43 as $W_{22}$, adaptive filter 46 as $W_{12}$, and adaptive filter 47 as $W_{21}$, a solution for perfect separation and deconvolution becomes:

$$W_{11}(z)=A_{11}(z)^{-1}, \quad W_{12}(z)=-A_{12}(z)A_{11}(z)^{-1},$$

$$W_{22}(z)=A_{22}(z)^{-1}, \quad W_{21}(z)=-A_{21}(z)A_{22}(z)^{-1},$$

By forcing $W_{11}=W_{22}=1$, the entropy at the output can be maximized without whitening the sources. In this case $W_{11}$ and $W_{22}$ have the following solutions:

$$W_{11}(z)=1, \quad W_{12}(z)=-A_{12}(z)A_{22}(z)^{-1},$$

$$W_{22}(z)=1, \quad W_{21}(z)=-A_{21}(z)A_{11}(z)^{-1}.$$

The adaptation equations for blind source separation system 40 of FIG. 6 are derived below using, for simplicity, only two sources. In the following equations, $w_{ikj}$ denotes the weight associated with delay k from mixture i to approximation signal i, and $W_{ikj}$ denotes the weight associated with delay k from approximation signal j to approximation signal i. Assuming FIR filters for $W_{ij}$, in the time domain the network carries out the following:

$$u_1(t) = \sum_{k=0}^{L_{11}} w_{1k1}x_1(t-k) + \sum_{k=1}^{L_{12}} w_{1k2}u_2(t-k)$$

$$u_2(t) = \sum_{k=0}^{L_{22}} w_{2k2}x_2(t-k) + \sum_{k=1}^{L_{21}} w_{2k1}u_1(t-k)$$

For the Jacobian, $$\ln|J| = \ln(y_1') + \ln(y_2') + \ln(D)$$
$$= \ln(y_1') + \ln(y_2') + \ln(w_{101}w_{202}).$$

There will now be three different cases: zero delay weights in direct filters, other weights in direct filters, and weights in feedback cross-filters. Following the steps in previous derivations for all these cases:

$$\Delta w_{i0i} \propto (1-2y_i)x_i + 1/w_{i0i},$$
$$\Delta w_{iki} \propto (1-2y_i)x_i(t-k),$$
$$\Delta w_{ikj} \propto (1-2y_i)u_j(t-k).$$

The zero delay weights again scale the data to maximize the information passed through the sigmoid, other weights in the direct branches of the network decorrelate each output from the corresponding input mixture (whitening), and the weights of the feedback branches decorrelate each output $y_i$ from all of the other sources (approximation signals $u_j$) at every time instant within the scope of the filters t–k (separation).

While this embodiment is disclosed using FIR filters, it will be understood by those skilled in the art that recursive filters (generally known as IIR filters) could be utilized instead and the adaption rules can be derived in the same way (as explained above).

Accordingly, a new and novel blind source separation system is disclosed that operates under real world conditions. The new and improved blind source separation system has the capabilities of dealing with sources that have been delayed with respect to each other and is capable of separating sources which include a sum of multipath copies of the sources distorted by the environment, which is not possible in prior art systems.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of recovering a plurality of source signals from an equal plurality of mixed signals, each mixed signal including components of the source signals, comprising the steps of:

multiplying a channel one mixed signal by a channel one adaptive weight to produce a channel one product signal;

multiplying a channel two mixed signal by a channel two adaptive weight to produce a channel two product signal;

generating a channel one filtered feedback signal from a channel two approximation signal;

generating a channel two filtered feedback signal from a channel one approximation signal;

adding the channel one filtered feedback signal to the channel one product signal to produce the channel one approximation signal;

adding the channel two filtered feedback signal to the channel two product signal to produce the channel two approximation signal;

applying a nonlinear function to the channel one and channel two approximation signals to produce the channel one and channel two output signals; and adjusting the channel one adaptive weight, the channel one filtered feedback signal, the channel two adaptive weight, and the channel two filtered feedback signal to maximize entropy of the channel one and the channel two output signals, thereby recovering a first source signal as the channel one output signal and a second source signal as the channel two output signal.

2. A method of recovering a plurality of source signals from an equal plurality of mixed signals as claimed in claim 1 wherein the step of adding the channel one filtered feedback signal to the channel one product signal includes, in addition, adding a channel one bias weight.

3. A method of recovering a plurality of source signals from an equal plurality of mixed signals as claimed in claim 2 wherein the step of adding the channel two filtered feedback signal to the channel two product signal includes, in addition, adding a channel two bias weight.

4. A method of recovering a plurality of source signals from an equal plurality of mixed signals as claimed in claim 1 wherein the step of generating the channel one filtered feedback signal includes delaying the channel two approximation signal and multiplying the delayed signal by a channel one feedback weight.

5. A method of recovering a plurality of source signals from an equal plurality of mixed signals as claimed in claim 4 wherein the step of generating the channel two filtered feedback signal includes delaying the channel one approximation signal and multiplying the delayed signal by a channel two feedback weight.

6. A method of recovering a plurality of source signals from an equal plurality of mixed signals as claimed in claim 5 wherein the step of adjusting the channel one adaptive weight and the channel two adaptive weight includes adjusting the weights in accordance with the following equations $$\Delta w_1 \propto (1-2y_1)x_1 + \frac{1}{w_1}$$

$$\Delta w_2 \propto (1-2y_2)x_2 + \frac{1}{w_2}$$

where:

$w_1$ and $w_2$ are the channel one and channel two adaptive weights;

$x_1$ and $x_2$ are channel one and channel two mixed signals; and $y_1$ and $y_2$ are first and second output signals.

7. A method of recovering a plurality of source signals from an equal plurality of mixed signals as claimed in claim 6 wherein the step of adjusting the channel one and the channel two filtered feedback signals includes adjusting the channel one and channel two feedback weights in accordance with the following equations $$\Delta w_{12} \propto (1-2y_1)u_2(t-d_{12})$$

$$\Delta w_{21} \propto (1-2y_2)u_1(t-d_{21})$$

where:

$w_{12}$ and $w_{21}$ are the channel one and channel two feedback weights;

$u_1$ and $u_2$ are channel one and channel two approximation signals;

$y_1$ and $y_2$ are first and second output signals; and $d_{12}$ and $d_{21}$ are amounts the channel one and channel two approximation signals are delayed.

8. A method of recovering a plurality of source signals from an equal plurality of mixed signals as claimed in claim 7 wherein the step of adjusting the channel one and the channel two filtered feedback signals includes adjusting the amounts the channel one and channel two approximation signals are delayed in accordance with the following equations $$\Delta d_{12} \propto -(1-2y_1)w_{12}\dot{u}_2(t-d_{12})$$

$$\Delta d_{21} \propto -(1-2y_2)w_{21}\dot{u}_1(t-d_{21})$$

where:

$w_{12}$ and $w_{21}$ are the channel one and channel two feedback weights;

$\dot{u}_1$ and $\dot{u}_2$ are time derivatives of channel one and channel two approximation signals;

$y_1$ and $y_2$ are first and second output signals; and $d_{12}$ and $d_{21}$ are the amount of delay in the channel one and channel two filtered feedback signals.

9. A method of recovering a plurality of source signals from an equal plurality of mixed signals as claimed in claim 1 wherein the steps of multiplying the channel one mixed signal by the channel one adaptive weight and multiplying the channel two mixed signal by the channel two adaptive weight include providing digital channel one and channel two mixed signals and providing digital channel one and channel two adaptive weights.

10. A method of recovering a plurality of source signals from an equal plurality of mixed signals as claimed in claim 1 wherein the step of multiplying the channel one mixed signal by the channel one adaptive weight to produce the channel one product signal includes multiplying the channel one mixed signal by a series of different weights associated with a series of different delays and doing a summation to produce the channel one product signal and the step of multiplying the channel two mixed signal by the channel two adaptive weight to produce the channel two product signal includes multiplying the channel two mixed signal by a series of different weights associated with a series of different delays and doing a summation to produce the channel two product signal.

11. A method of recovering a plurality of source signals from an equal plurality of mixed signals as claimed in claim 10 wherein the step of generating the channel one filtered feedback signal includes multiplying the channel two approximation signal by a series of different weights associated with a series of different delays and doing a summation to produce the channel one filtered feedback signal and the step of generating the channel two filtered feedback signal includes multiplying the channel one approximation signal by a series of different weights associated with a series of different delays and doing a summation to produce the channel two filtered feedback signal.

12. A method of recovering a plurality of source signals from an equal plurality of mixed signals, each mixed signal including components of the source signals, comprising the steps of:

multiplying a channel one mixed signal by a channel one series of different weights associated with a series of different delays and doing a summation to produce a channel one product signal;

multiplying a channel two mixed signal by a channel two series of different weights associated with a series of different delays and doing a summation to produce a channel two product signal.

generating a channel one filtered feedback signal from a channel two approximation signal including delaying the channel two approximation signal and multiplying the channel two approximation signal by a series of different weights associated with a series of different delays and doing a summation to produce the channel one filtered feedback signal;

generating a channel two filtered feedback signal from a channel one approximation signal including delaying the channel one approximation signal and multiplying the channel one approximation signal by a series of different weights associated with a series of different delays and doing a summation to produce the channel two filtered feedback signal;

adding the channel one filtered feedback signal to the channel one product signal to produce the channel one approximation signal;

adding the channel two filtered feedback signal to the channel two product signal to produce the channel two approximation signal;

applying a nonlinear function to the channel one and channel two approximation signals to produce the channel one and channel two output signals; and adjusting the channel one series of different weights associated with a series of different delays, the channel one filtered feedback signal, the channel two series of different weights associated with a series of different delays, and the channel two filtered feedback signal to maximize entropy of the channel one and channel two output signals, thereby recovering a channel one source signal as the channel one output signal and a channel two source signal as the channel two output signal.

13. A method of recovering a plurality of source signals from an equal plurality of mixed signals as claimed in claim 12 wherein the step of multiplying the channel one mixed signal by the channel one series of different weights associated with the series of different delays and doing the summation to produce the channel one product signal includes performing the following $$\sum_{k=0}^{L_{11}} w_{1k1} x_1(t-k)$$

and the step of multiplying the channel two mixed signal by the channel two series of different weights associated with the series of different delays and doing the summation to produce the channel two product signal includes performing the following $$\sum_{k=0}^{L_{22}} w_{2k2} x_2(t-k)$$

where:

$w_{1k1}$ and $w_{2k2}$ are weights associated with delay k in channel one and channel two; and $x_1$ and $x_2$ are channel one and channel two mixed signals.

14. A method of recovering a plurality of source signals from an equal plurality of mixed signals as claimed in claim 13 wherein the step of generating the channel one filtered feedback signal includes performing the following $$\sum_{k=1}^{L_{12}} w_{1k2} u_2(t-k)$$

and the step of multiplying the channel two mixed signal by the channel two adaptive weight to produce the channel two product signal includes performing the following $$\sum_{k=1}^{L_{21}} w_{2k1} u_1(t-k)$$

where:

$w_{1k2}$ and $w_{2k1}$ are the weights associated with delay k in channel one and channel two; and $u_1$ and $u_2$ are channel one and channel two approximation signals.

15. A method of recovering a plurality of source signals from an equal plurality of mixed signals, each mixed signal including components of the source signals, comprising the steps of:

generating a channel one approximation signal as follows $$\sum_{k=0}^{L_{11}} w_{1k1} x_1(t-k) + \sum_{k=1}^{L_{12}} w_{1k2} u_2(t-k)$$

generating a channel two approximation signal as follows $$\sum_{k=0}^{L_{22}} w_{2k2} x_2(t-k) + \sum_{k=1}^{L_{21}} w_{2k1} u_1(t-k)$$

where:

$w_{1k1}$ and $w_{2k2}$ are weights associated with delay k in channel one and channel two, $w_{1k2}$ and $w_{2k1}$ are the weights associated with delay k in channel one and channel two, $u_1$ and $u_2$ are channel one and channel two approximation signals, and $x_1$ and $x_2$ are channel one and channel two mixed signals;

applying a nonlinear function to the channel one and channel two approximation signals to produce a channel one and a channel two output signal; and adjusting $W_{1k1}$, $W_{2k2}$, $W_{1k2}$, and $W_{2k1}$ to maximize entropy of the channel one and channel two output signals, respectively, thereby recovering a channel one source signal as the channel one output signal and a channel two source signal as the channel two output signal.

16. A method of recovering a plurality of source signals from an equal plurality of mixed signals as claimed in claim 15 wherein the step of adjusting $w_{1k1}$, $w_{2k2}$, $w_{1k2}$, and $w_{2k1}$ includes adjusting the weights in accordance with the following equations $$\Delta w_{i0i} \propto (1-2y_i)x_i + 1/w_{i0i},$$

$$\Delta w_{iki} \propto (1-2y_i)x_i(t-k),$$

$$\Delta w_{ikj} \propto (1-2y_i)u_j(t-k).$$

* * * * *